United States Patent
Chiang et al.

(10) Patent No.: US 10,164,065 B1
(45) Date of Patent: Dec. 25, 2018

(54) FILM DEPOSITION FOR 3D SEMICONDUCTOR STRUCTURE

(71) Applicant: TAIWAN SEMICONDUCTOR MANUFACTURING CO., LTD., Hsinchu (TW)

(72) Inventors: Hsin-Che Chiang, Taipei (TW); Ju-Yuan Tzeng, New Taipei (TW); Chun-Sheng Liang, Changhua County (TW); Shu-Hui Wang, Hsinchu (TW); Chih-Yang Yeh, Hsinchu County (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/629,862

(22) Filed: Jun. 22, 2017

Related U.S. Application Data

(60) Provisional application No. 62/512,736, filed on May 31, 2017.

(51) Int. Cl.
*H01L 29/66* (2006.01)
*H01L 29/78* (2006.01)
*H01L 29/423* (2006.01)

(52) U.S. Cl.
CPC .. *H01L 29/66795* (2013.01); *H01L 29/42364* (2013.01); *H01L 29/66545* (2013.01); *H01L 29/785* (2013.01)

(58) Field of Classification Search
CPC ......... H01L 29/66795; H01L 29/66545; H01L 29/785

USPC .......................................................... 438/142
See application file for complete search history.

(56) References Cited

U.S. PATENT DOCUMENTS

| | | | |
|---|---|---|---|
| 8,906,760 B2 * | 12/2014 | Ranjan | H01L 21/02112 438/197 |
| 9,601,586 B1 * | 3/2017 | Kittl | H01L 29/41791 |
| 2015/0102422 A1 * | 4/2015 | Cai | H01L 27/0886 257/383 |
| 2016/0005607 A1 * | 1/2016 | Russell | C23C 16/45536 438/563 |
| 2018/0247939 A1 * | 8/2018 | Glass | H01L 29/785 |

* cited by examiner

*Primary Examiner* — David Vu
*Assistant Examiner* — Brandon Fox
(74) *Attorney, Agent, or Firm* — McClure, Qualey & Rodack, LLP

(57) ABSTRACT

In a method for manufacturing a semiconductor device, a first raised structure is formed on a surface of a substrate. The first raised structure includes a top surface and a side surface adjoining the top surface. The side surface includes an upper portion, a middle portion, and a lower portion. A deposition operation is performed with a precursor to form a first film on the top surface, the upper portion and the lower portion of the side surface, and the surface of the substrate. Performing the deposition operation includes controlling a saturated vapor pressure of the precursor. A re-deposition operation is performed on the first film and the first raised structure, so as to form a film structure. A thickness of the film structure on the middle portion of the side surface is smaller than a thickness of the film structure on the top surface.

20 Claims, 17 Drawing Sheets

FILM DEPOSITION FOR 3D SEMICONDUCTOR STRUCTURE

RELATED APPLICATIONS

This application claims priority to U.S. Provisional Application Ser. No. 62/512,736, filed May 31, 2017, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
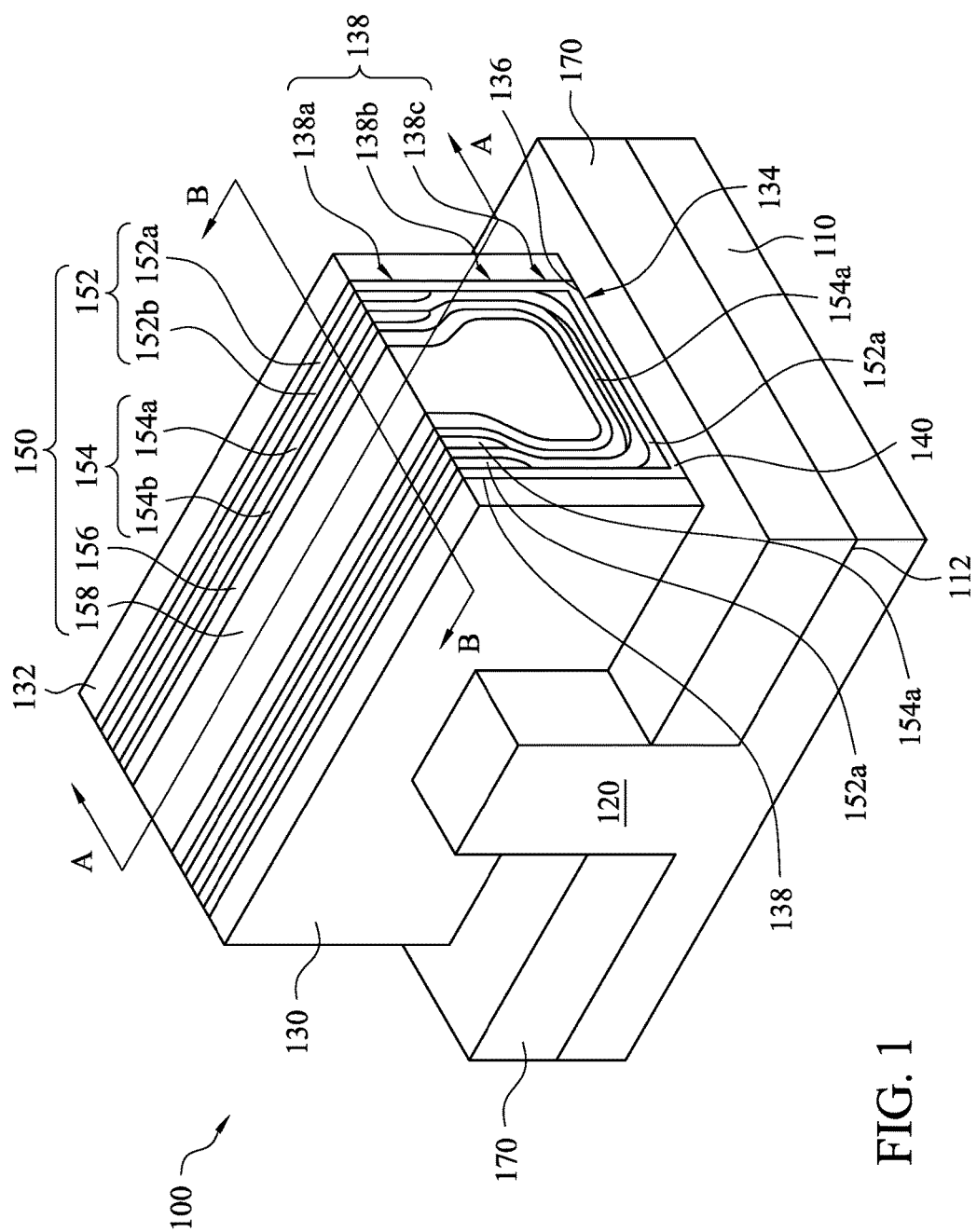
FIG. 1 is schematic perspective drawing of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In a typical process for manufacturing a FinFET device, a metal gate is conformal to a fin structure and has a uniform thickness. However, a sidewall or a bottom of the fin structure needs a thinner metal gate for a threshold voltage (Vt) tuning, and a top of the fin structure needs a thicker metal gate for preventing etching damage. As the semiconductor IC industry has progressed into nanometer technology process nodes, the thickness of the metal gate is more critical, and the metal gate with the uniform thickness is not satisfactory.

Embodiments of the present disclosure are directed to providing a semiconductor device and a method for manufacturing the semiconductor device, in which a deposition operation is performed by controlling a saturated vapor pressure of a precursor to form a first film on a top portion of a three-dimensional structure, such as a raised structure or a trench, and a re-deposition operation is performed on the first film and the three-dimensional structure to form a film structure which is thinner on a middle portion of the three-dimensional structure and is thicker on the top portion of the three-dimensional structure. Thus, a non-uniform metal gate can be achieved, in which the metal gate is thicker on a top portion of the three-dimensional structure for preventing etching damage, and the metal gate is thinner on a middle portion of the three-dimensional structure for Vt tuning.

FIG. 1 is schematic perspective drawing of a semiconductor device in accordance with various embodiments. In some examples, the semiconductor device 100 is a FinFET device. The semiconductor device 100 may include a substrate 110, a fin structure 120, two spacers 130 and 132, a gate dielectric layer 140, and a gate structure 150. The semiconductor device 100 may further include isolation structures 170.

The fin structure 120 is disposed on the substrate 110. In some examples, the fin structure 120 is formed by recessing the substrate 110, and thus the fin structure 120 protrudes from a recessed surface 112 of the substrate 110, in which the fin structure 120 and the substrate 110 are formed from the same material. The substrate 110 and the fin structure 120 may be composed of a single-crystalline semiconductor material or a compound semiconductor material. For example, silicon, germanium or glass may be used as a material of the substrate 110 and the fin structure 120. In some exemplary examples, the substrate 110 and the fin structure 120 are composed of silicon.

Referring to FIG. 1 again, the isolation structures 170 are disposed on two opposite sides of the fin structure 120, in which the isolation structures 170 respectively cover lower portions of the fin structure 120. For example, the isolation structures 170 extend along a direction that the fin structure 120 extends along. In some exemplary examples, the isolation structures 170 are formed from silicon oxide.

Figure 2:
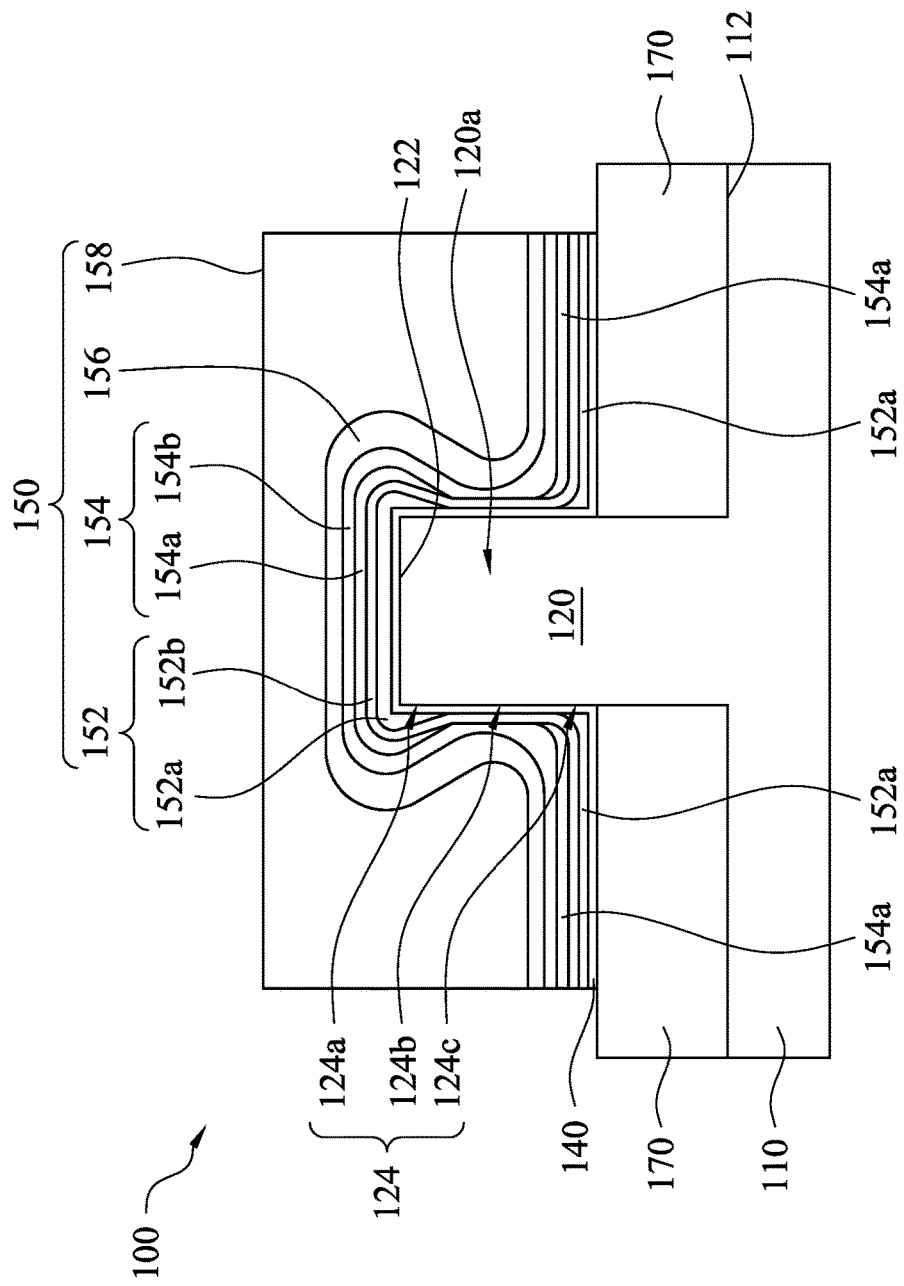
FIG. 2 is schematic cross-sectional view of the semiconductor device in FIG. 1 taken along a line A-A.
Figure 3:
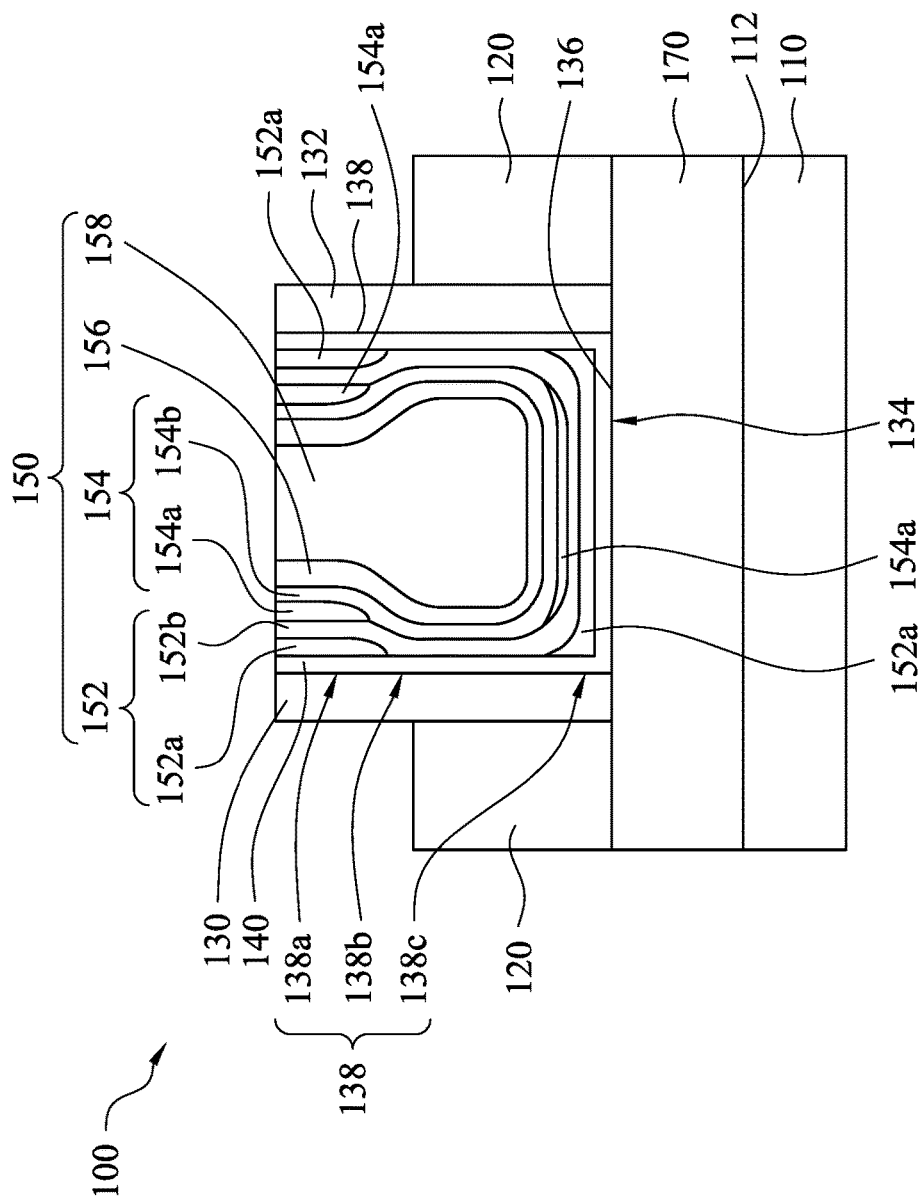
FIG. 3 is schematic cross-sectional view of the semiconductor device in FIG. 1 taken along a line B-B.

Referring to FIG. 2 and FIG. 3 with FIG. 1, FIG. 2 is schematic cross-sectional view of the semiconductor device in FIG. 1 taken along a line A-A, and FIG. 3 is schematic cross-sectional view of the semiconductor device in FIG. 1 taken along a line B-B. The fin structure 120 includes a first portion 120a and two second portions 120b, in which the first portion 120a is located between the second portions 120b and is sandwiched by the second portions 120b. The fin structure 120 includes a top surface 122 and a first side surface 124. The first side surface 124 of the fin structure 210 adjoins the top surface 122 of the fin structure 120. As shown in FIG. 2, the first side surface 124 of the fin structure 210 includes a first upper portion 124a, a first middle portion 124b, and a first lower portion 124c, in which the first middle portion 124b is located between the first upper portion 124a and the first lower portion 124c, and is sandwiched between the first upper portion 124a and the first lower portion 124c.

The spacers 130 and 132 are disposed on the second portions 120b of the fin structure 120, such that a trench 134 is formed over the first portion 120a of the fin structure 120 between the spacers 130 and 132. In some examples, the spacers 130 and 132 are formed from silicon nitride or silicon oxynitride. As shown in FIG. 3, the trench 134 includes a bottom surface 136 and two second side surfaces 138, in which the second side surfaces 138 respectively adjoin two opposite sides of the bottom surface 136. Each of the second side surfaces 138 of the trench 134 includes a second upper portion 138a, a second middle portion 138b, and a second lower portion 138c, in which the second middle portion 138b is sandwiched between the second upper portion 138a and the second lower portion 138c.

Referring to FIG. 2 and FIG. 3 again, the gate dielectric layer 140 covers the first portion 120a of the fin structure 120, and the bottom surface 136 and second side surfaces 138 of the trench 134. The gate dielectric layer 140 covers the top surface 122 and the first side surface 124 at the first portion 120a of the fin structure 120. As shown in FIG. 2, the gate dielectric layer 140 may further cover the portions of the isolation structures 170. For example, the gate dielectric layer 140 may be formed from silicon oxide.

As shown in FIG. 1, the gate structure 150 is disposed on the gate dielectric layer 140 in the trench 134. The gate structure 150 may include at least one film structure and a gate 158. In some examples, as shown in FIG. 2, the gate structure 150 includes two film structures 152 and 154, an n-type work function metal (NWFM) 156, and the gate 158. The film structure 152 may include a first film 152a and a second film 152b. The first film 152a is disposed on the top surface 122 of the fin structure 120, the first upper portion 124a and the first lower portion 124c of the first side surface 124 of the fin structure 120, and the gate dielectric layer 140 on the surface 112 of the substrate 110. In some exemplary examples, the first film 152a further covers the first middle portion 124b of the first side surface 124 of the fin structure 120, and a thickness of the first film 152a on the first middle portion 124b of the first side surface 124 of the fin structure 120 is smaller than those of the first film 152a on the top surface 122 of the fin structure 120, and on the first upper portion 124a and the first lower portion 124c of the first side surface 124 of the fin structure 120. The second film 152b is disposed on the first film 152a. In some exemplary examples, the second film 152b further covers the first middle portion 124b of the first side surface 124 of the fin structure 120.

As shown in FIG. 3, the first film 152a of the film structure 152 is disposed on the second upper portions 138a and the second lower portions 138c of the second side surfaces 138 of the trench 134. In some exemplary examples, the first film 152a further covers the second middle portions 138b of the second side surfaces 138 of the trench 134, and a thickness of the first film 152a on the second middle portions 138b of the second side surfaces 138 of the trench 134 is smaller than those of the first film 152a on the second upper portions 138a and the second lower portions 138c of the second side surfaces 138 of the trench 134. The second film 152b is disposed on the first film 152a. In some exemplary examples, the second film 152b further covers the second middle portions 138b of the second side surfaces 138 of the trench 134. In some exemplary examples, the film structure 152 is a capping layer. For example, the film structure 152 may be formed from titanium nitride (TiN).

Referring to FIG. 2 again, the film structure 154 may include a first film 154a and a second film 154b. The first film 154a is disposed on the film structure 152 on the top surface 122 of the fin structure 120, the first upper portion 124a and the first lower portion 124c of the first side surface 124 of the fin structure 120, and the gate dielectric layer 140 on the surface 112 of the substrate 110. In some exemplary examples, the first film 154a further covers the film structure 152 on the first middle portion 124b of the first side surface 124 of the fin structure 120, and a thickness of the first film 154a on the film structure 152 on the first middle portion 124b of the first side surface 124 of the fin structure 120 is smaller than those of the first film 154a on the film structure 152 on the top surface 122 of the fin structure 120, and on the first upper portion 124a and the first lower portion 124c of the first side surface 124 of the fin structure 120. The second film 154b is disposed on the first film 154a. In some exemplary examples, the second film 154b further covers the film structure 152 on the first middle portion 124b of the first side surface 124 of the fin structure 120.

Referring to FIG. 3 again, the first film 154a of the film structure 154 is disposed on the film structure 152 on the second upper portions 138*a* and the second lower portions 138*c* of the second side surfaces 138 of the trench 134. In some exemplary examples, the first film 154*a* further covers the film structure 152 on the second middle portions 138*b* of the second side surfaces 138 of the trench 134, and a thickness of the first film 154*a* on the film structure 152 on the second middle portions 138*b* of the second side surfaces 138 of the trench 134 is smaller than those of the first film 154*a* on the film structure 152 on the second upper portions 138*a* and the second lower portions 138*c* of the second side surfaces 138 of the trench 134. The second film 154*b* is disposed on the first film 154*a*. In some exemplary examples, the second film 154*b* further covers the film structure 152 on the second middle portions 138*b* of the second side surfaces 138 of the trench 134. In some exemplary examples, the film structure 154 is an etching stop layer. For example, the film structure 154 may be formed from tantalum nitride (TaN).

Referring to FIG. 2 and FIG. 3, the n-type work function metal 156 is disposed on the film structure 154 and covers the film structure 154. The gate 158 is disposed on the n-type work function metal 156 on the film structure 154 in the trench 134. In some exemplary examples, the gate 158 is formed from tungsten.

In the semiconductor device 100, the thicknesses of the combination of the film structures 152 and 154 on the first middle portion 124*b* of the first side surface 124 of the fin structure 120 and the second middle portions 138*b* of the second side surfaces 138 of the trench 134 are smaller than those of the combination of the film structures 152 and 154 on the top surface 122 of the fin structure 120, the first upper portion 124*a* and the first lower portion 124*c* of the first side surface 124 of the fin structure 120, the second upper portions 138*a* and the second lower portions 138*c* of the second side surfaces 138 of the trench 134, such that distances from the n-type work function metal 156 to a channel of the semiconductor device 100 through the first middle portion 124*b* of the first side surface 124 of the fin structure 120 and the second middle portions 138*b* of the second side surfaces 138 of the trench 134 are decreased, and thus reducing Vt of the semiconductor device 100.

Figure 4A:
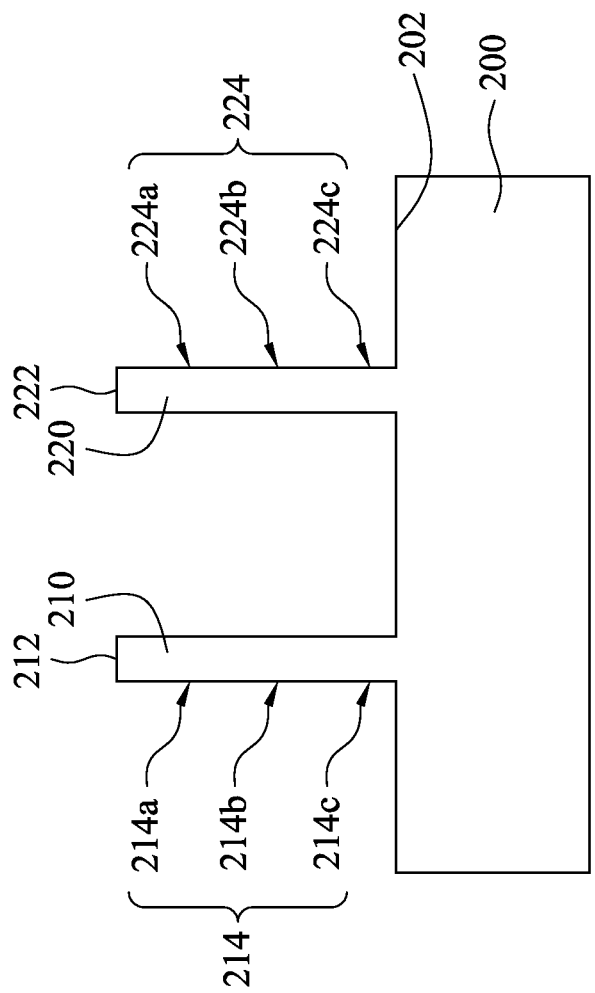
FIG. 4A through FIG. 4C are schematic cross-sectional views of intermediate stages showing a method for manufacturing a semiconductor device in accordance with various embodiments.
Figure 4B:
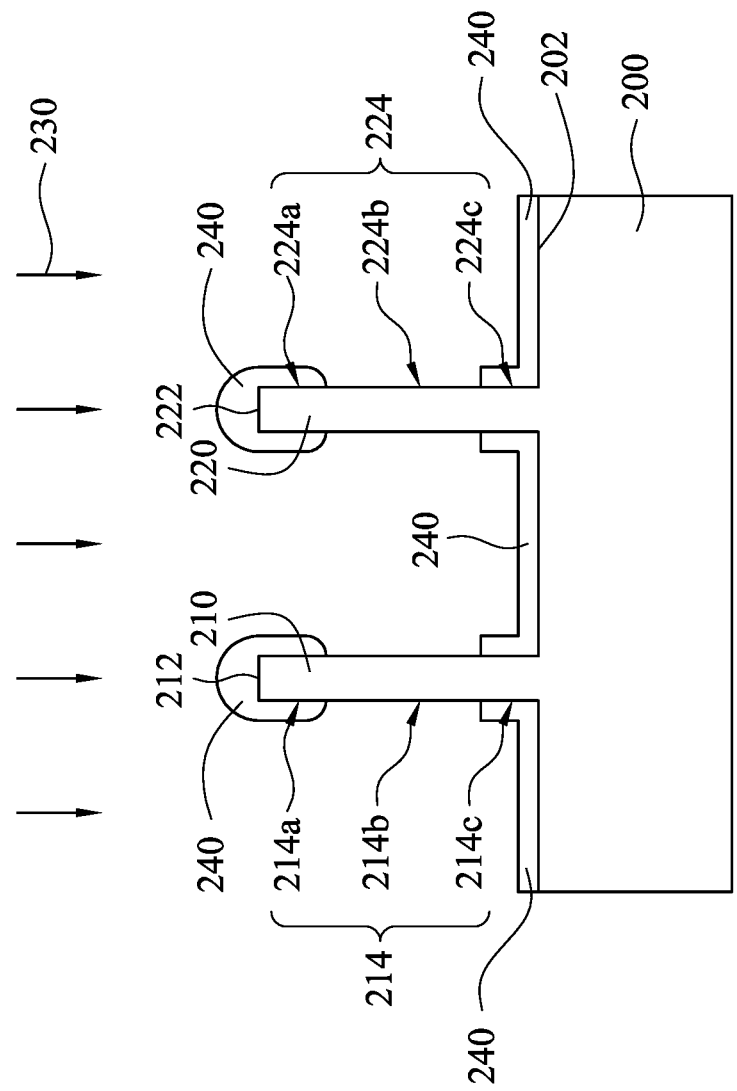
Figure 4C:
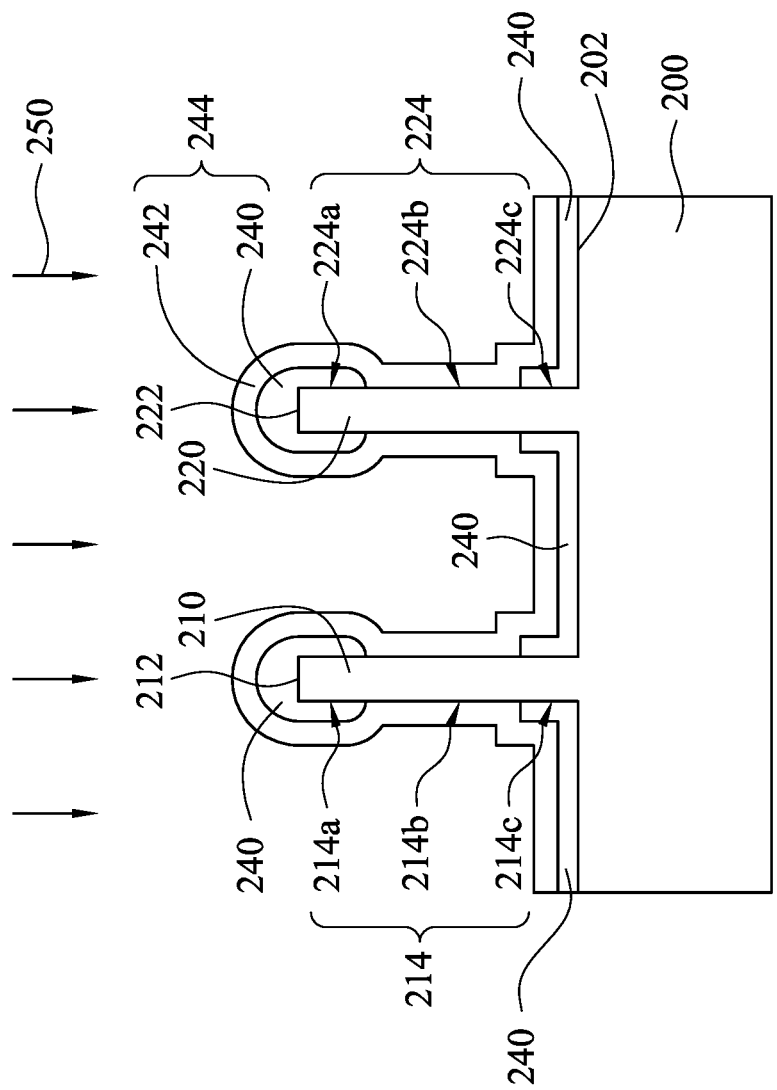

FIG. 4A through FIG. 4C are schematic cross-sectional views of intermediate stages showing a method for manufacturing a semiconductor device in accordance with various embodiments. As shown in FIG. 4A, a substrate 200 is provided. A first raised structure 210 is formed a surface 202 of the substrate 200. In some examples, a second raised structure 220 is formed on the surface 202 of the substrate 200. The second raised structure 220 may be adjacent to the first raised structure 210. In some exemplary examples, the first raised structure 210 and the second raised structure 220 are formed by recessing the substrate 200, such that the first raised structure 210 and the second raised structure 220 protrude from the recessed surface 202 of the substrate 200. Thus, the first raised structure 210, the second raised structure 220, and the substrate 200 are formed from the same material. The substrate 200, the first raised structure 210, and the second raised structure 220 may be composed of a single-crystalline semiconductor material or a compound semiconductor material. For example, silicon, germanium or glass may be used as a material of the substrate 200, the first raised structure 210, and the second raised structure 220. In some exemplary examples, the substrate 200, the first raised structure 210, and the second raised structure 220 are composed of silicon.

Referring to FIG. 4A again, the first raised structure 210 includes a top surface 212 and a side surface 214, in which the side surface 214 adjoins the top surface 212. The side surface 214 includes an upper portion 214*a*, a middle portion 214*b*, and a lower portion 214*c*, in which the middle portion 214*b* is sandwiched between the upper portion 214*a* and the lower portion 214*c*. The second raised structure 220 includes a top surface 222 and a side surface 224, in which the side surface 224 adjoins the top surface 222. The side surface 224 includes an upper portion 224*a*, a middle portion 224*b*, and a lower portion 224*c*, in which the middle portion 224*b* is sandwiched between the upper portion 224*a* and the lower portion 224*c*.

As shown in FIG. 4B, a deposition operation 230 is performed with at least one precursor. In some examples, the deposition operation 230 is performed by using a chemical vapor deposition-like (CVD-like) technique. For example, a deposition mode of the deposition operation 230 may be between a deposition mode of an atomic layer deposition (ALD) process and a deposition mode of a chemical vapor deposition process. Performing the deposition operation includes controlling a process temperature to control a saturated vapor pressure of the at least one precursor, so as to form a first film 240 on the top surface 212 of the first raised structure 210, the upper portion 214*a* and the lower portion 214*c* of the side surface 214 of the first raised structure 210, and the surface 202 of the substrate 200. In the examples which the second raised structure 220 is formed adjacent to the first raised structure 210, performing the deposition operation further forms the first film 240 on the top surface 222 of the second raised structure 220, and the upper portion 224*a* and the lower portion 224*c* of the side surface 224 of the second raised structure 220. In some exemplary examples, a thickness of the first film 240 is substantially less than 1 nm and greater than 0.

In certain examples, the first film 240 may be formed to further cover the middle portion 214*b* of the side surface 214 of the first raised structure 210 and the middle portion 224*b* of the side surface 224 of the second raised structure 220, in which thicknesses of the first film 240 on the middle portion 214*b* of the side surface 214 of the first raised structure 210 and the middle portion 224*b* of the side surface 224 of the second raised structure 220 are smaller than those of the first film 240 on the top surface 212 of the first raised structure 210, the upper portion 214*a* and the lower portion 214*c* of the side surface 214 of the first raised structure 210, the top surface 222 of the second raised structure 220, the upper portion 224*a* and the lower portion 224*c* of the side surface 224 of the second raised structure 220, and the surface 202 of the substrate 200.

Referring to FIG. 4C, a re-deposition operation 250 is performed on the first film 240, the first raised structure 210, and the second raised structure 220, so as to form a film structure 250. In some examples, the re-deposition operation 250 is performed by using an atomic layer deposition technique. In some exemplary examples, as shown in FIG. 4C, performing the re-deposition operation 250 includes forming a second film 242 on the first film 240, the middle portion 214*b* of the side surface 214 of the first raised structure 210, and the middle portion 224*b* of the side surface 224 of the first raised structure 220, such that the film structure 244 includes the first film 240 and the second film 242. In some exemplary examples, a thickness of the second film 242 is substantially less than 1 nm and greater than 0. In the present embodiment, one or more re-deposition operations 250 can be performed to form the film structure 244.

Thicknesses of the film structure 244 on the middle portion 214*b* of the side surface 214 of the first raised structure 210 and the middle portion 224*b* of the side surface 224 of the second raised structure 220 are smaller than those of the film structure 244 on the top surface 212 of the first raised structure 210 and the top surface 222 of the second raised structure 220. In some exemplary examples, the thickness of the film structure 244 on the top surface 212 of the first raised structure 210 is greater than a thickness of the film structure 244 on the lower portion 214c of the side surface 214 of the first raised structure 210, and the thickness of the film structure 244 on the top surface 222 of the second raised structure 220 is greater than a thickness of the film structure 244 on the lower portion 224c of the side surface 224 of the second raised structure 220. In addition, a thickness of the film structure 244 on a region of the surface 202 of the substrate 200 between the first raised structure 210 and the second raised structure 220 is substantially equal to a thickness of the film structure 244 on the other region of the surface 202 of the substrate 200.

In certain examples, the second film 242 is not formed on the middle portion 214b of the side surface 214 of the first raised structure 210 and the middle portion 224b of the side surface 224 of the second raised structure 220, such that the thicknesses of the film structure 244 on the middle portion 214b of the side surface 214 of the first raised structure 210 and the middle portion 224b of the side surface 224 of the second raised structure 220 are substantially equal to 0.

For example, the film structure 244 may be formed from a $HfO_2$ based material, and the process temperature of the deposition operation 230 substantially ranges from 170 degrees centigrade to 190 degrees centigrade. The film structure 244 may be formed from TiN, and the process temperature of the deposition operation 230 substantially ranges from 25 degrees centigrade to 40 degrees centigrade. The film structure 244 may be formed from TaN, and the process temperature of the deposition operation substantially ranges from 65 degrees centigrade to 80 degrees centigrade. A material forming the film structure 244 may include TiAlC and TaAlC, and the process temperature of the deposition operation 230 substantially ranges from 40 degrees centigrade to 60 degrees centigrade.

The film structure 144 is formed by performing the deposition operation 230 and the re-deposition operation 250. The deposition operation 230 is performed by controlling the process temperature to control the saturated vapor pressure of the precursor, as so to control the amount of the precursor, such that the first film 240 may not be formed on the middle portion 214b of the side surface 214 of the first raised structure 210 and the middle portion 224b of the side surface 224 of the second raised structure 220, and thus the film structure 244 with a non-uniform thickness can be formed.

Figure 5:
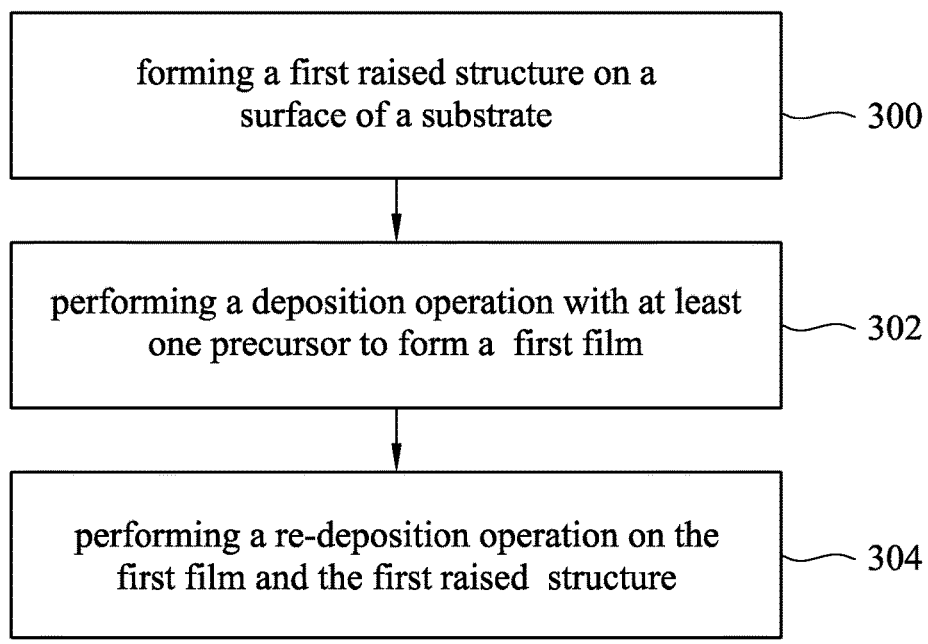
FIG. 5 is a flow chart of a method for manufacturing a semiconductor device in accordance with various embodiments.

Referring to FIG. 5 with FIG. 4A through FIG. 4C, FIG. 5 is a flow chart of a method for manufacturing a semiconductor device in accordance with various embodiments. The method begins at operation 500, where a first raised structure 410 is formed on a surface 202 of a substrate 200, as shown in FIG. 4A. In forming the first raised structure 410, the substrate 200 is provided. In some examples, the first raised structure 210 is formed by recessing the substrate 200, and thus the first raised structure 210 protrudes from the recessed surface 202 of the substrate 200. In some exemplary examples, a second raised structure 220 is formed on the surface 202 of the substrate 200. The second raised structure 220 may be adjacent to the first raised structure 210. The second raised structure 220 is formed in recessing the substrate 200. Thus, the first raised structure 210, the second raised structure 220, and the substrate 200 are formed from the same material.

As shown in FIG. 4A, the first raised structure 210 includes a top surface 212 and a side surface 214 adjoining the top surface 212. The side surface 214 includes an upper portion 214a, a middle portion 214b, and a lower portion 214c, in which the middle portion 214b is sandwiched between the upper portion 214a and the lower portion 214c. The second raised structure 220 includes a top surface 222 and a side surface 224 adjoining the top surface 222. The side surface 224 includes an upper portion 224a, a middle portion 224b, and a lower portion 224c, in which the middle portion 224b is sandwiched between the upper portion 224a and the lower portion 224c.

At operation 302, as shown in FIG. 4B, a deposition operation 230 is performed with at least one precursor. In some examples, the deposition operation 230 is performed by using a CVD-like technique. For example, a deposition mode of the deposition operation 230 may be between a deposition mode of an atomic layer deposition process and a deposition mode of a chemical vapor deposition process. Performing the deposition operation includes controlling a process temperature to control a saturated vapor pressure of the at least one precursor, so as to form a first film 240 on the top surface 212 of the first raised structure 210, the upper portion 214a and the lower portion 214c of the side surface 214 of the first raised structure 210, the top surface 222 of the second raised structure 220, the upper portion 224a and the lower portion 224c of the side surface 224 of the second raised structure 220, and the surface 202 of the substrate 200.

In certain examples, the first film 240 may be formed to further cover the middle portion 214b of the side surface 214 of the first raised structure 210 and the middle portion 224b of the side surface 224 of the second raised structure 220. The thicknesses of the first film 240 on the middle portion 214b of the side surface 214 of the first raised structure 210 and the middle portion 224b of the side surface 224 of the second raised structure 220 are smaller than those of the first film 240 on the top surface 212 of the first raised structure 210, the upper portion 214a and the lower portion 214c of the side surface 214 of the first raised structure 210, the top surface 222 of the second raised structure 220, the upper portion 224a and the lower portion 224c of the side surface 224 of the second raised structure 220, and the surface 202 of the substrate 200.

At operation 304, as shown in FIG. 4C, a re-deposition operation 250 is performed on the first film 240, the first raised structure 210, and the second raised structure 220, so as to form a film structure 250. In some examples, the re-deposition operation 250 is performed by using an atomic layer deposition technique. In some exemplary examples, performing the re-deposition operation 250 includes forming a second film 242 on the first film 240, the middle portion 214b of the side surface 214 of the first raised structure 210, and the middle portion 224b of the side surface 224 of the first raised structure 220, such that the film structure 244 includes the first film 240 and the second film 242.

The film structure 244 on the middle portion 214b of the side surface 214 of the first raised structure 210 and the middle portion 224b of the side surface 224 of the second raised structure 220 are thinner than the film structure 244 on the top surface 212 of the first raised structure 210 and the top surface 222 of the second raised structure 220. In some exemplary examples, the film structure 244 on the top surface 212 of the first raised structure 210 is thicker than the film structure 244 on the lower portion 214c of the side surface 214 of the first raised structure 210, and the film structure 244 on the top surface 222 of the second raised structure 220 is thicker than the film structure 244 on the lower portion 224c of the side surface 224 of the second raised structure 220. In addition, a thickness of the film structure 244 on a region of the surface 202 of the substrate 200 between the first raised structure 210 and the second raised structure 220 is substantially equal to a thickness of the film structure 244 on the other region of the surface 202 of the substrate 200.

In certain examples, the second film 242 is not formed on the middle portion 214b of the side surface 214 of the first raised structure 210 and the middle portion 224b of the side surface 224 of the second raised structure 220, Thus, the thicknesses of the film structure 244 on the middle portion 214b of the side surface 214 of the first raised structure 210 and the middle portion 224b of the side surface 224 of the second raised structure 220 may be substantially equal to 0.

Figure 6A:
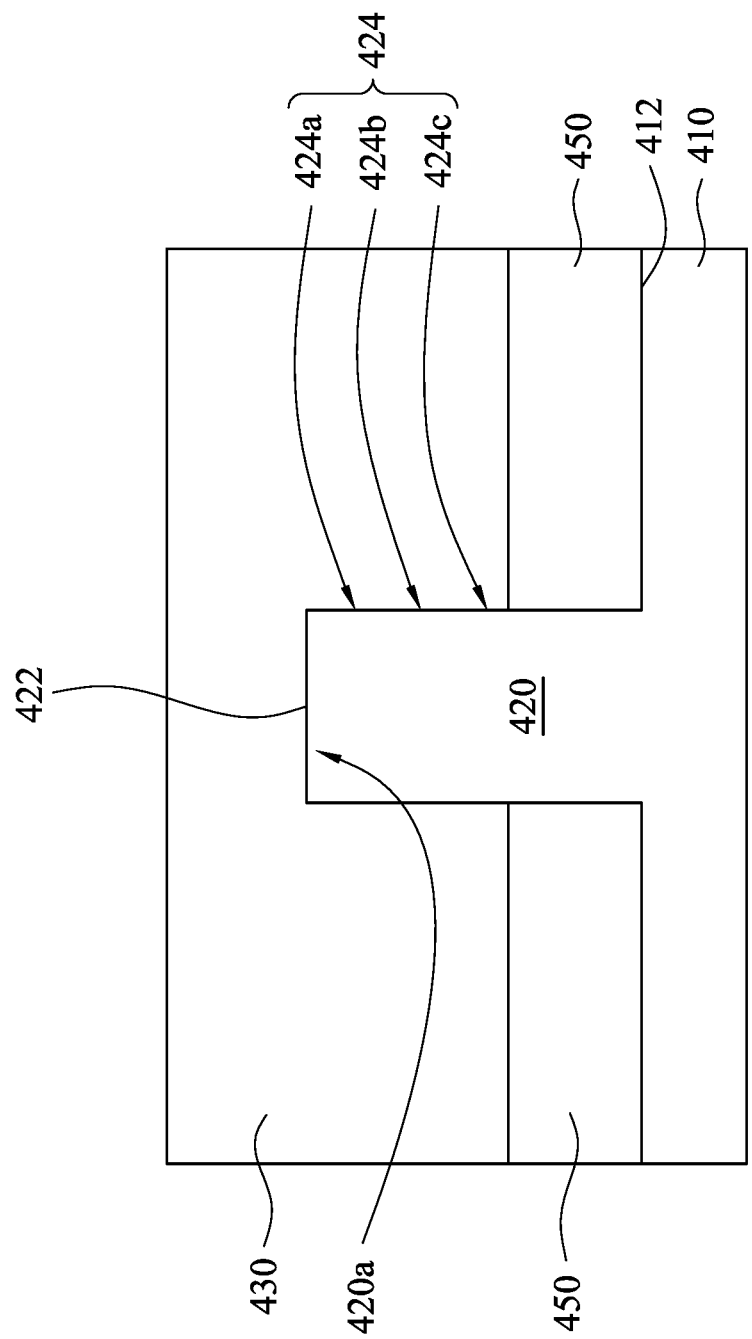
FIG. 6A through FIG. 9B are schematic cross-sectional views of intermediate stages showing a method for manufacturing a semiconductor device in accordance with various embodiments.
Figure 8A:
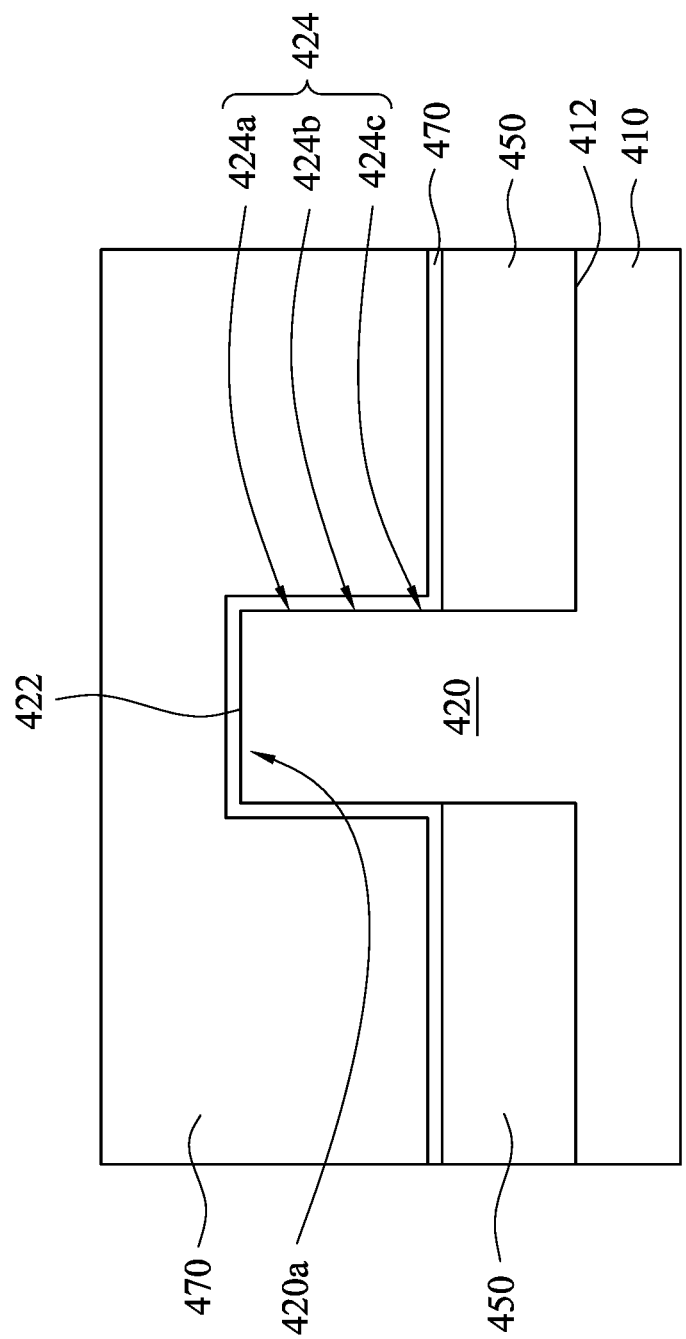
Figure 8B:
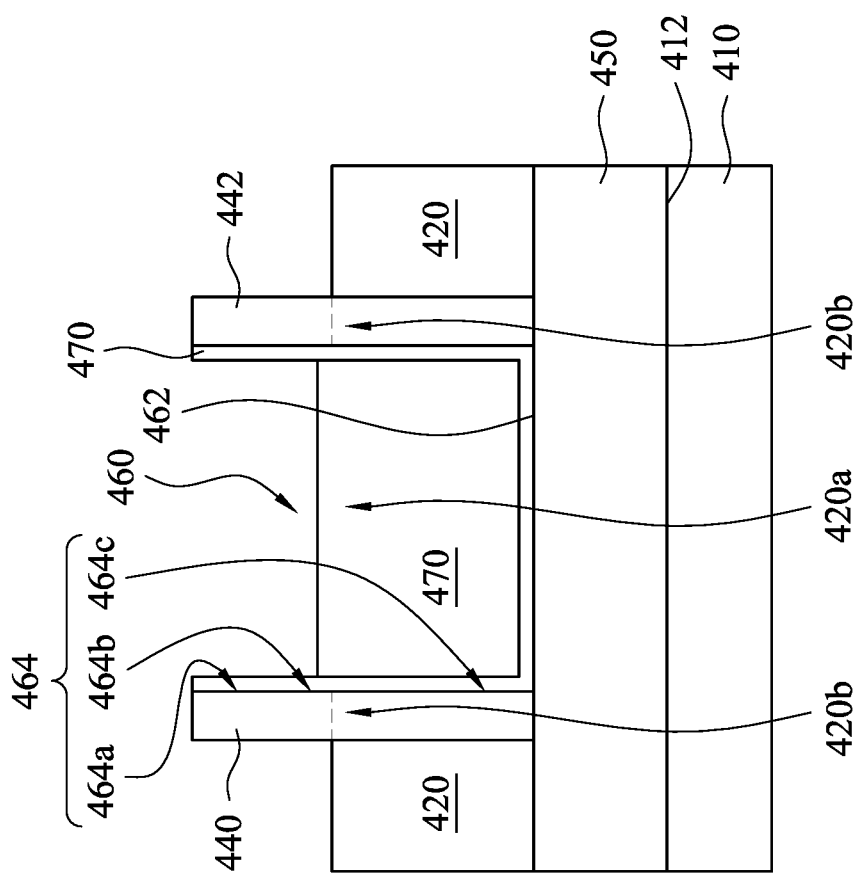
Figure 9A:
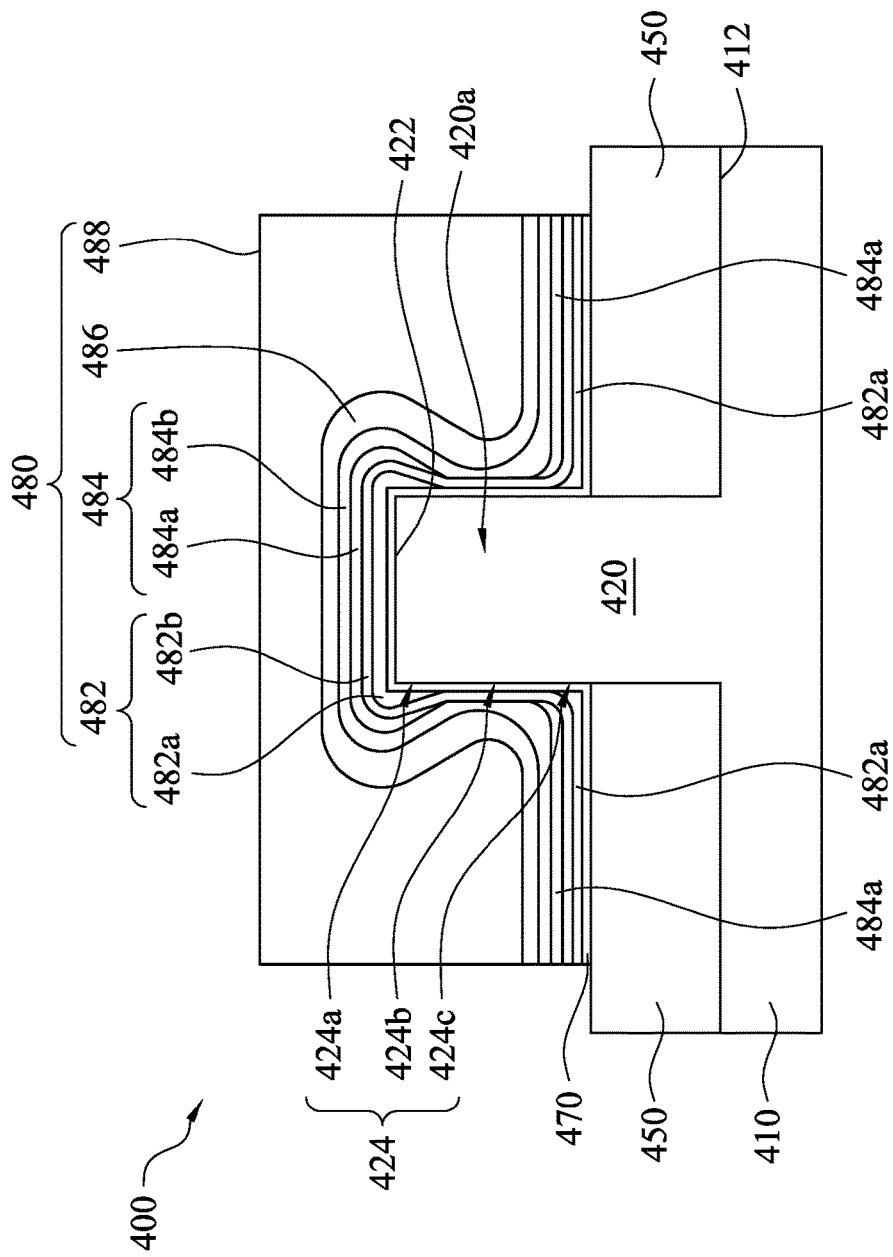
Figure 9B:
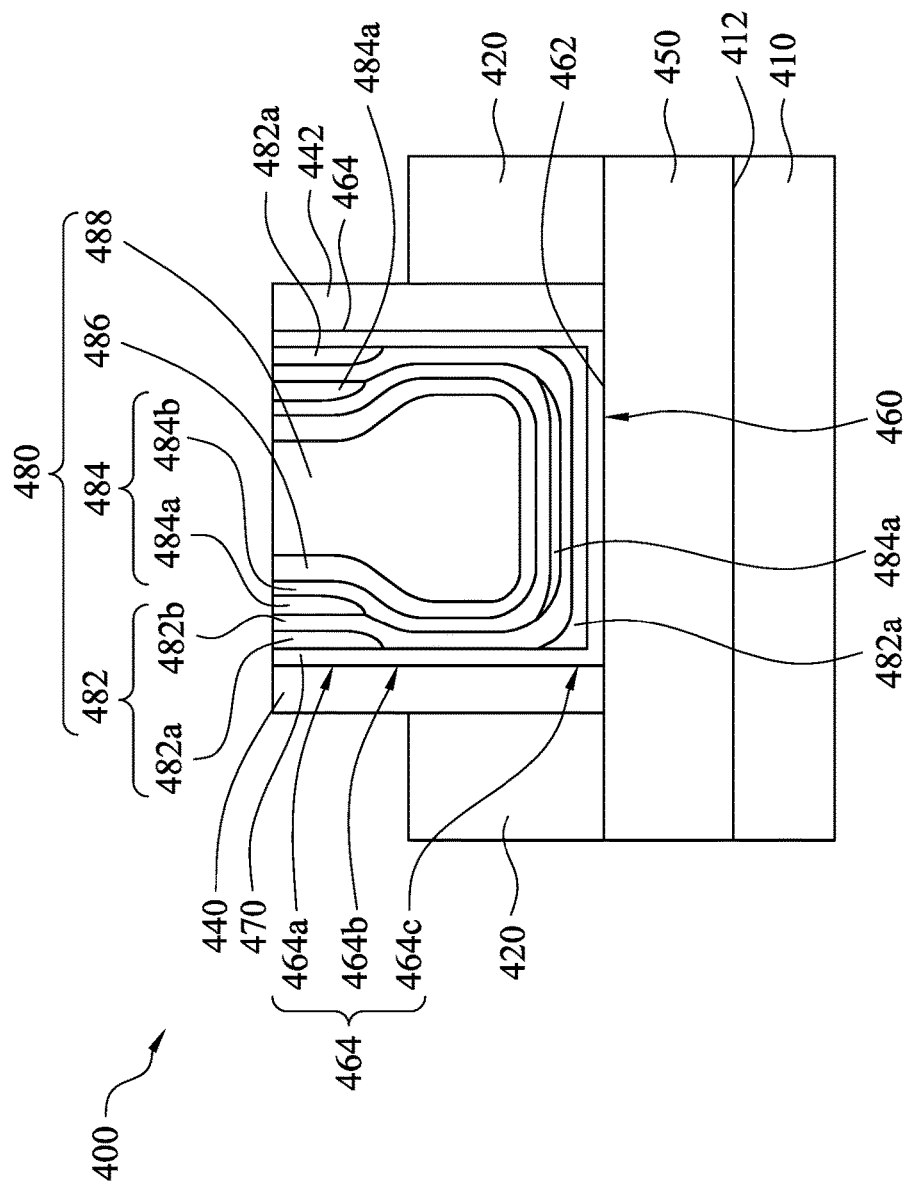
Figure 10:
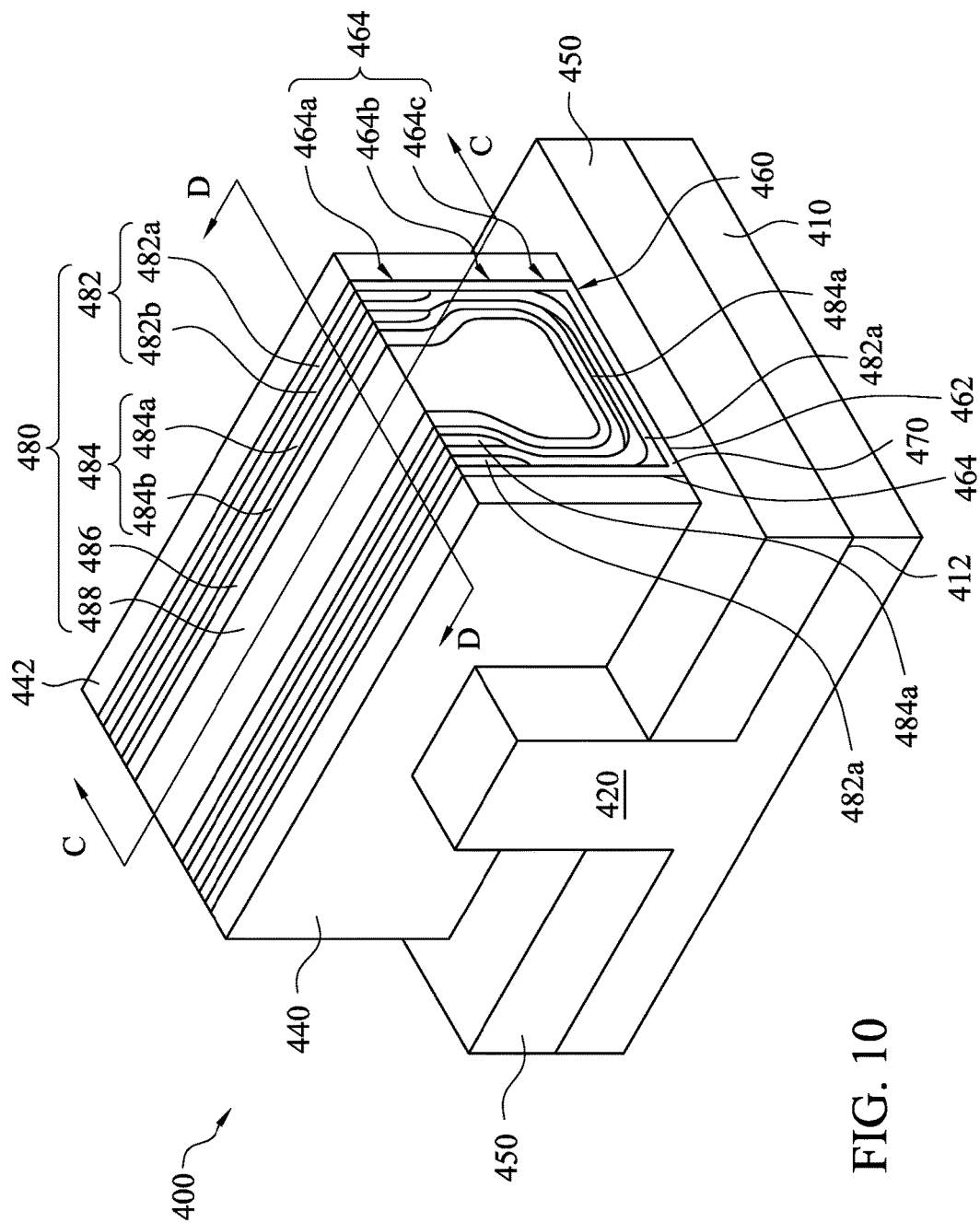
FIG. 10 is schematic perspective drawing of a semiconductor device in accordance with various embodiments.

Referring to FIG. 10 with FIG. 6A through FIG. 9B, FIG. 10 is schematic perspective drawing of a semiconductor device in accordance with various embodiments, FIG. 6A through FIG. 9B are schematic cross-sectional views of intermediate stages showing a method for manufacturing the semiconductor device shown in FIG. 10 in accordance with various embodiments, in which FIG. 6A, FIG. 7A, FIG. 8A, and FIG. 9A are taken along a line C-C shown in FIG. 10, and FIG. 6B, FIG. 7B, FIG. 8B, and FIG. 9B are taken along a line D-D shown in FIG. 10. In manufacturing a semiconductor device 400 shown in FIG. 10, a substrate 410 with a fin structure 420, a dummy gate 430, and two spacers 440 and 442 is provided. As shown in FIG. 6A, the fin structure 420 protrudes from a surface 412 of the substrate 410. In some exemplary examples, the fin structure 420 is formed by recessing the substrate 410. Thus, the fin structure 420 and the substrate 410 are formed from the same material. The substrate 410 and the fin structure 420 may be composed of a single-crystalline semiconductor material or a compound semiconductor material. For example, silicon, germanium or glass may be used as a material of the substrate 410 and the fin structure 420. In some exemplary examples, the substrate 410 and the fin structure 420 are composed of silicon.

Referring to FIG. 6A again, the fin structure 420 includes a top surface 422 and a first side surface 424 adjoining the top surface 422. The first side surface 424 of the fin structure 420 includes a first upper portion 424a, a first middle portion 424b, and a first lower portion 424c, in which the first middle portion 424b is sandwiched between the first upper portion 424a and the first lower portion 424c.

Figure 6B:
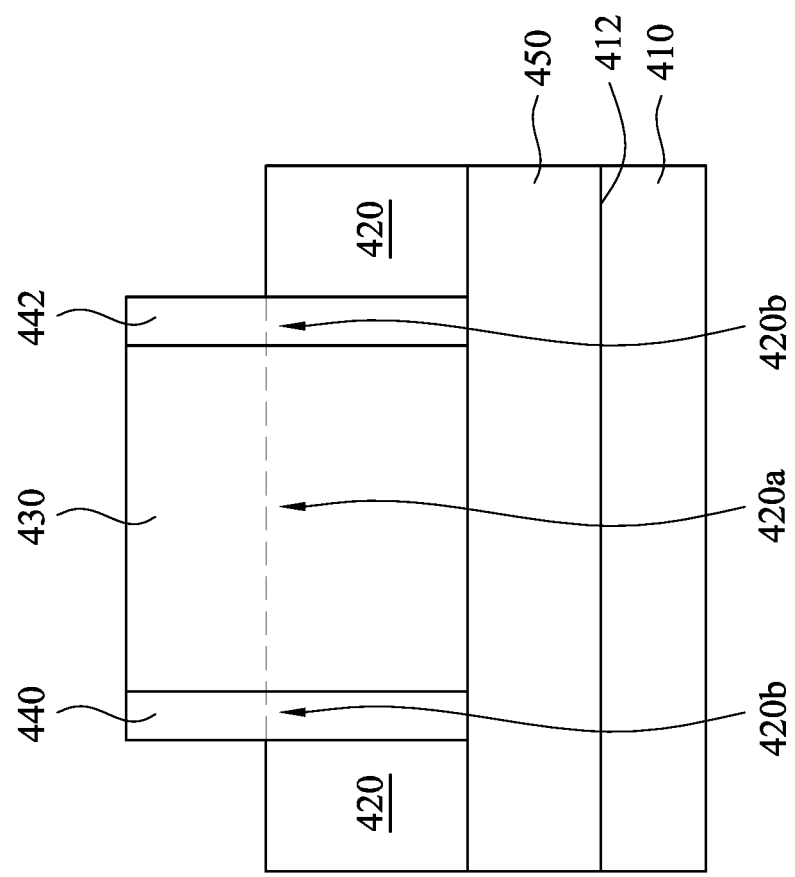

As shown in FIG. 6A and FIG. 6B, the dummy gate 430 is formed on a first portion 420a of the fin structure 420, and the spacers 440 and 442 are disposed on second portions 420b of the fin structure 420. The first portion 420a of the fin structure 420 is located and sandwiched between the second portions 420b of the fin structure 420, such that the spacers 440 and 442 sandwich the dummy gate 430. In some examples, the dummy gate 430 is formed from polysilicon, and the spacers 440 and 442 are formed from silicon nitride or silicon oxynitride.

Referring to FIGS. 6A and 6B again, the substrate 410 may be provided with isolation structures 450. The isolation structures 450 are formed on two opposite sides of the fin structure 420, in which the isolation structures 450 respectively cover lower portions of the fin structure 420. For example, the isolation structures 450 extend along a direction that the fin structure 420 extends along. In some exemplary examples, the isolation structures 450 are formed from silicon oxide. For example, the isolation structures 450 may be formed by using a high density plasma CVD (HDP CVD) technique.

Figure 7A:
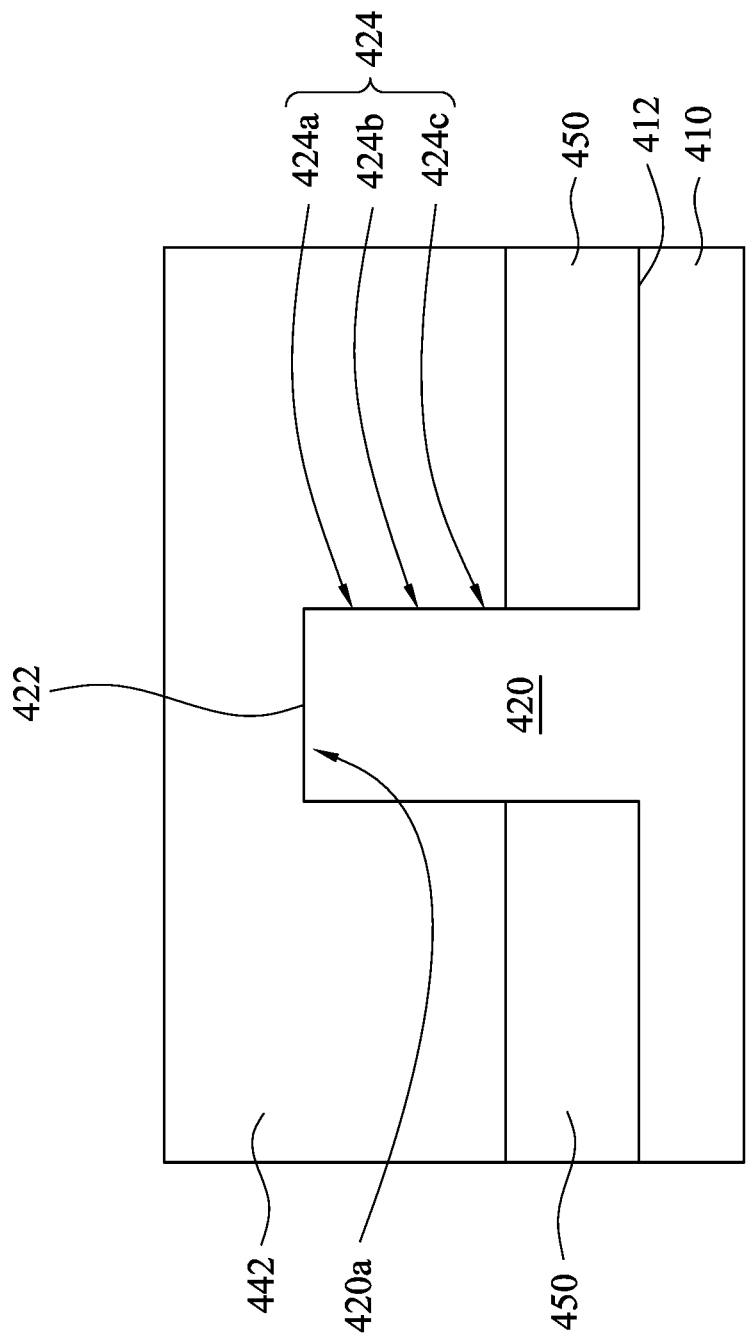
Figure 7B:
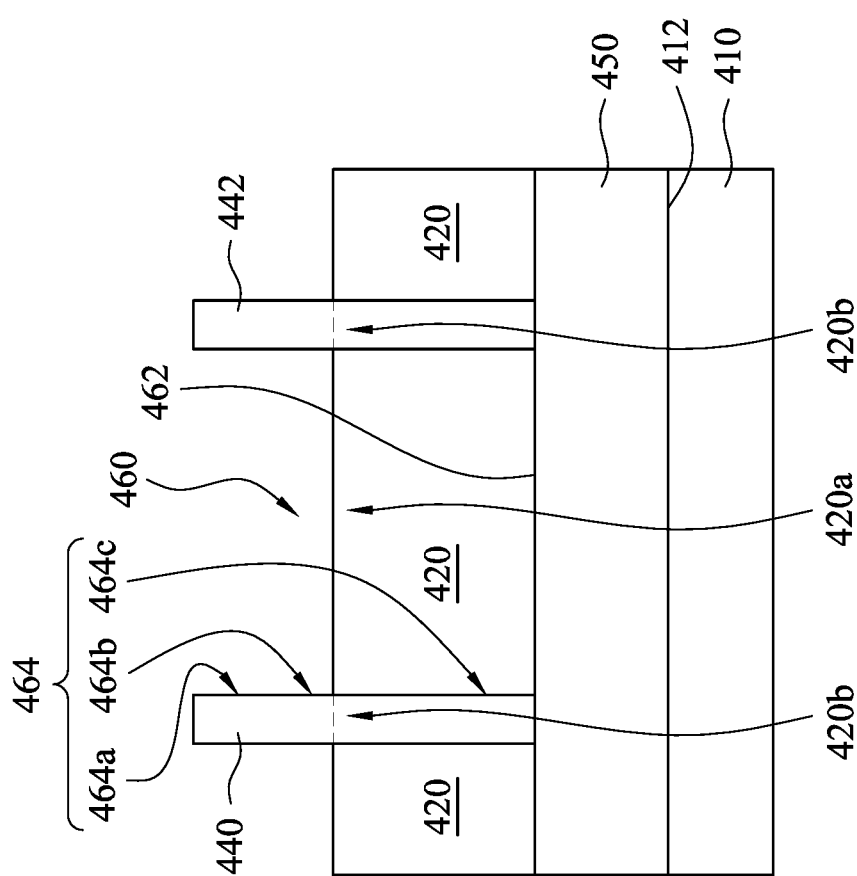

As shown in FIGS. 7A and 7B, the dummy gate 430 is removed by using, for example, an etching technique. After the dummy gate 430 is removed, the first portion 420a of the fin structure 420 is exposed, and a trench 460 is formed between the spacers 440 and 442. The trench 460 includes a bottom surface 462 and second side surfaces 464, in which the second side surfaces 464 respectively adjoin two opposite sides of the bottom surface 462. As shown in FIG. 7B, each of the second side surfaces 464 of the trench 460 includes a second upper 464a, a second middle portion 464b, and a second lower portion 464c, in which the second middle portion 464b is sandwiched between the second upper portion 464a and the second lower portion 464c.

As shown in FIG. 8A and FIG. 8B, a gate dielectric layer 470 is formed to cover the first portion 420a of the fin structure 420, and the bottom surface 462 and the second side surfaces 464 of the trench 460. The gate dielectric layer 470 covers the top surface 422 and the first side surface 424 at the first portion 420a of the fin structure 420. As shown in FIG. 8A, the gate dielectric layer 470 may further cover the portions of the isolation structures 450. The gate dielectric layer 470 may be formed by using a deposition technique, such as a chemical vapor deposition technique. For example, the gate dielectric layer 470 may be formed from silicon oxide.

As shown in FIG. 9B, a gate structure 480 is formed on the gate dielectric layer 470 in the trench 460. In some examples, forming the gate structure 480 includes forming at least one film structure and a gate 488. In some exemplary examples, as shown in FIG. 9A and FIG. 9B, forming the gate structure 480 includes forming two film structures 482 and 484, an n-type work function metal 486, and the gate 488.

In forming the film structure 482, a deposition operation is performed with at least one precursor by controlling a process temperature to control a saturated vapor pressure of the at least one precursor, so as to form a first film 482a on the top surface 422 of the fin structure 420, the first upper portion 424a and the first lower portion 424c of the first side surface 424 of the fin structure 420, the second upper portions 464a and the second lower portions 464c of the second side surfaces 464 of the trench 460, and the gate dielectric layer 470 on the surface 412 of the substrate 410. In some exemplary examples, the first film 482a is formed to have a thickness which is substantially less than 1 nm and greater than 0. In some examples, the deposition operation is performed by using a CVD-like technique. For example, a deposition mode of the deposition operation may be between a deposition mode of an atomic layer deposition process and a deposition mode of a chemical vapor deposition process.

In certain examples, the first film 482a may be formed to further cover the first middle portion 424b of the first side surface 424 of the fin structure 420 and the second middle portions 464b of the second side surfaces 464 of the trench 460, in which thicknesses of the first film 482a on the first middle portion 424b of the first side surface 424 of the fin structure 420 and the second middle portions 464b of the second side surfaces 464 of the trench 460 are smaller than those of the first film 482a on the top surface 422 of the fin structure 420, the first upper portion 424a and the first lower portion 424c of the first side surface 424 of the fin structure 420, and those on the second upper portions 464a and the second lower portions 464c of the second side surfaces 464 of the trench 460.

In forming the film structure 482, after the first film 482a is completed, a re-deposition operation is performed on the first film 482a, the fin structure 420, and the trench 460, so as to form the film structure 482. In some examples, the re-deposition operation is performed by using an atomic layer deposition technique. In some exemplary examples, as shown in FIG. 9A and FIG. 9B, performing the re-deposition operation includes forming a second film 482b on the first film 482a, the first middle portion 424b of the first side surface 424 of the fin structure 420, and the second middle portions 464b of the second side surfaces 464 of the trench 460, such that the film structure 482 includes the first film 482a and the second film 482b. In some exemplary examples, a thickness of the second film 482b is substantially less than 1 nm and greater than 0. In the present embodiment, one or more re-deposition operations can be performed to form the film structure 482. In some exemplary examples, the film structure 482 is a capping layer. For example, the film structure 482 may be formed from titanium nitride.

Thicknesses of the film structure 482 on the first middle portion 424b of the first side surface 424 of the fin structure 420 and the second middle portions 464b of the second side surfaces 224 of the trench 460 are smaller than those of the film structure 482 on the top surface 422 of the fin structure 420, the first upper portion 424a of the first side surface 424 of the fin structure 420, and the second upper portions 464a of the second side surfaces 464 of the trench 460. In some exemplary examples, the thickness of the film structure 482 on the top surface 422 of the fin structure 420 is greater than a thickness of the film structure 482 on the first lower portion 424c of the first side surface 424 of the fin structure 420.

In certain examples, the second film 482b is not formed on the first middle portion 424b of the first side surface 424 of the fin structure 420 and the second middle portions 464b of the second side surfaces 264 of the trench 460. Thus, the thicknesses of the film structure 482 on the first middle portion 424b of the first side surface 424 of the fin structure 420 and the second middle portions 464b of the second side surfaces 464 of the trench 460 may be substantially equal to 0.

In forming the film structure 484, a deposition operation is performed with at least one precursor by controlling a process temperature to control a saturated vapor pressure of the at least one precursor, so as to form a first film 484a on the film structure 482 on the top surface 422 of the fin structure 420, the first upper portion 424a and the first lower portion 424c of the first side surface 424 of the fin structure 420, the second upper portions 464a and the second lower portions 464c of the second side surfaces 464 of the trench 460, and the gate dielectric layer 470 on the surface 412 of the substrate 410. In some exemplary examples, the first film 484a is formed to have a thickness which is substantially less than 1 nm and greater than 0. In some examples, the deposition operation is performed by using a CVD-like technique. For example, a deposition mode of the deposition operation may be between a deposition mode of an atomic layer deposition process and a deposition mode of a chemical vapor deposition process.

In certain examples, the first film 484a may be formed on the first middle portion 424b of the first side surface 424 of the fin structure 420 and the first middle portions 464b of the second side surfaces 464 of the trench 460, in which thicknesses of the first film 484a on the first middle portion 424b of the first side surface 424 of the fin structure 420 and the second middle portions 464b of the second side surfaces 464 of the trench 460 are smaller than those of the first film 484a on the top surface 422 of the fin structure 420, the first upper portion 424a and the first lower portion 424c of the first side surface 424 of the fin structure 420, and those on the second upper portions 464a and the second lower portions 464c of the second side surfaces 464 of the trench 460.

In forming the film structure 484, after the first film 484a is completed, a re-deposition operation is performed on the first film 484a and the film structure 482, so as to form the film structure 484. In some examples, the re-deposition operation is performed by using an atomic layer deposition technique. In some exemplary examples, as shown in FIG. 9A and FIG. 9B, performing the re-deposition operation includes forming a second film 484b on the first film 484a and the film structure 482, such that the film structure 484 includes the first film 484a and the second film 484b. In some exemplary examples, a thickness of the second film 484b is substantially less than 1 nm and greater than 0. In the present embodiment, one or more re-deposition operations can be performed to form the film structure 484. In some exemplary examples, the film structure 484 is an etching stop layer. For example, the film structure 484 may be formed from tantalum nitride.

Thicknesses of the film structure 484 on the first middle portion 424b of the first side surface 424 of the fin structure 420 and the second middle portions 464b of the second side surfaces 224 of the trench 460 are smaller than those of the film structure 484 on the top surface 422 of the fin structure 420, the first upper portion 424a of the first side surface 424 of the fin structure 420, and the second upper portions 464a of the second side surfaces 464 of the trench 460. In some exemplary examples, the thickness of the film structure 484 on the top surface 422 of the fin structure 420 is greater than a thickness of the film structure 484 on the first lower portion 424c of the first side surface 424 of the fin structure 420.

In certain examples, the second film 484b is not formed on the film structure 482 on the first middle portion 424b of the first side surface 424 of the fin structure 420 and the second middle portions 464b of the second side surfaces 264 of the trench 460. Thus, the thicknesses of the film structure 484 on the film structure 482 on the first middle portion 424b of the first side surface 424 of the fin structure 420 and the second middle portions 464b of the second side surfaces 464 of the trench 460 may be substantially equal to 0.

Referring to FIG. 9A, FIG. 9B, and FIG. 9C, the n-type work function metal 486 is formed on the film structure 484 and covers the film structure 484. The gate 488 is formed on the n-type work function metal 486 on the film structure 484 in the trench 460 to complete the semiconductor device 400. In some exemplary examples, the gate 488 is formed by using a physical vapor deposition (PVD) technique. For example, the gate 488 may be formed from tungsten.

Figure 11:
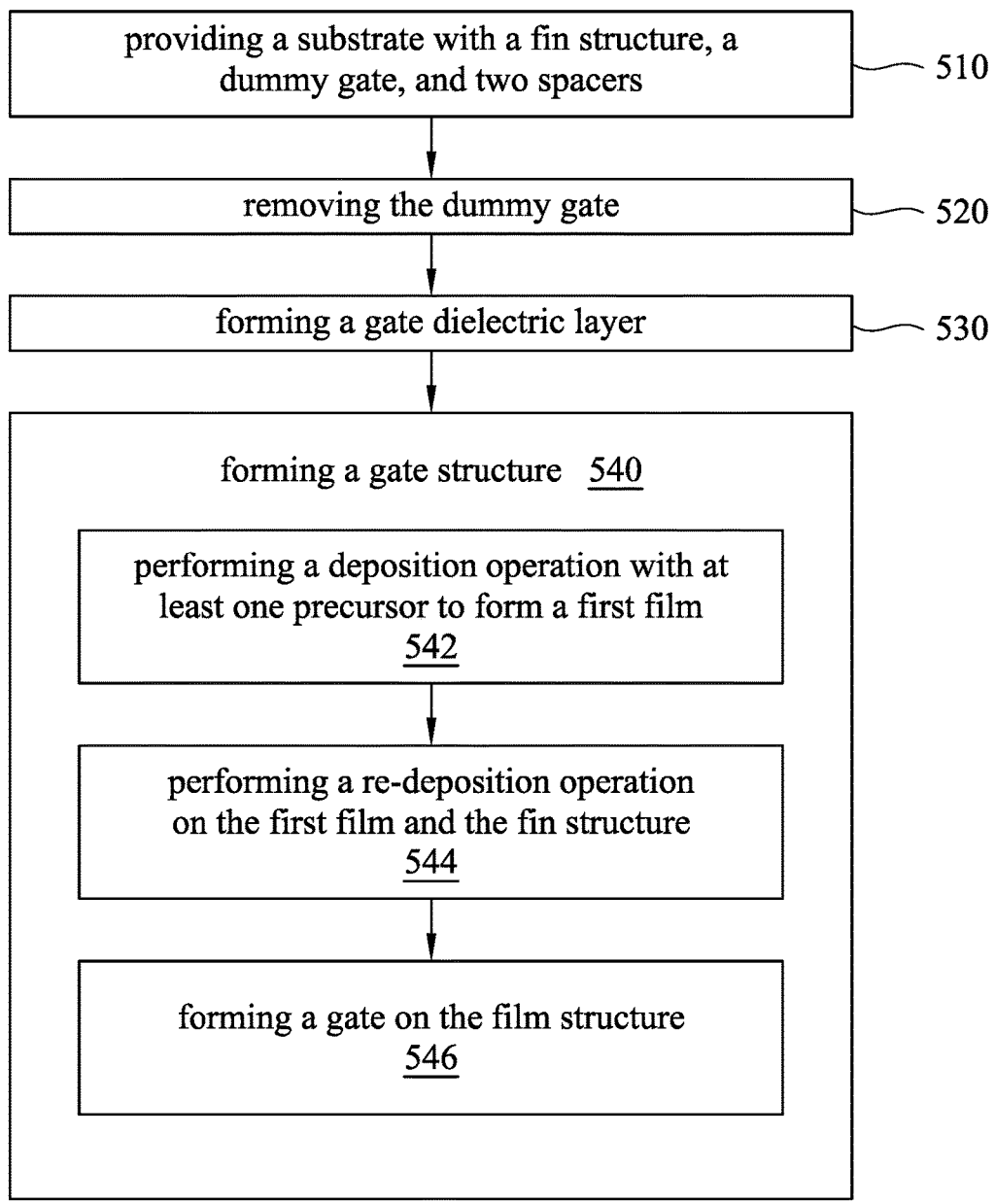
FIG. 11 is a flow chart of a method for manufacturing a semiconductor device in accordance with various embodiments.

Referring to FIG. 11 with FIG. 6A through FIG. 10, FIG. 11 is a flow chart of a method for manufacturing a semiconductor device in accordance with various embodiments. The method begins at operation 510, where a substrate 410 with a fin structure 420, a dummy gate 430, and two spacers 440 and 442 is provided. As shown in FIG. 6A, the fin structure 420 may be formed by recessing the substrate 410, and thus the fin structure 420 protrudes from a surface 412 of the substrate 410, and the fin structure 420 and the substrate 410 are formed from the same material. The fin structure 420 includes a top surface 422 and a first side surface 424 adjoining the top surface 422. The first side surface 424 of the fin structure 420 includes a first upper portion 424a, a first middle portion 424b, and a first lower portion 424c, in which the first middle portion 424b is sandwiched between the first upper portion 424a and the first lower portion 424c.

As shown in FIG. 6A and FIG. 6B, the dummy gate 430 is formed on a first portion 420a of the fin structure 420, and the spacers 440 and 442 are disposed on second portions 420b of the fin structure 420. The first portion 420a of the fin structure 420 is located and sandwiched between the second portions 420b of the fin structure 420, such that the dummy gate 430 is sandwiched between the spacers 440 and 442. Referring to FIGS. 6A and 6B again, the substrate 410 may be provided with isolation structures 450. The isolation structures 450 are formed on two opposite sides of the fin structure 420 by using a HDP CVD technique. The isolation structures 450 may be formed to respectively cover lower portions of the fin structure 420. For example, the isolation structures 450 extend along a direction that the fin structure 420 extends along.

At operation 520, as shown in FIG. 7A and FIG. 7B, the dummy gate 430 is removed by using, for example, an etching technique. After the dummy gate 430 is removed, the first portion 420a of the fin structure 420 is exposed, and a trench 460 is formed between the spacers 440 and 442. The trench 460 includes a bottom surface 462 and second side surfaces 464, in which the second side surfaces 464 respectively adjoin two opposite sides of the bottom surface 462. Each of the second side surfaces 464 of the trench 460 includes a second upper 464a, a second lower portion 464c, and a second middle portion 464b, which is sandwiched between the second upper portion 464a and the second lower portion 464c.

At operation 530, as shown in FIG. 8A and FIG. 8B, a gate dielectric layer 470 is formed to cover the first portion 420a of the fin structure 420, and the bottom surface 462 and the second side surfaces 464 of the trench 460 by using a deposition technique, such as a chemical vapor deposition technique. The gate dielectric layer 470 is formed to cover the top surface 422 and the first side surface 424 at the first portion 420a of the fin structure 420. As shown in FIG. 8A, the gate dielectric layer 470 may further cover the portions of the isolation structures 450.

At operation 540, as shown in FIG. 9B, a gate structure 480 is formed on the gate dielectric layer 470 in the trench 460. In some examples, as shown in FIG. 9A and FIG. 9B, forming the gate structure 480 includes forming two film structures 482 and 484, an n-type work function metal 486, and a gate 488. In forming the film structure 482, a deposition operation is performed with at least one precursor by controlling a process temperature to control a saturated vapor pressure of the precursor, so as to form a first film 482a on the top surface 422 of the fin structure 420, the first upper portion 424a and the first lower portion 424c of the first side surface 424 of the fin structure 420, the second upper portions 464a and the second lower portions 464c of the second side surfaces 464 of the trench 460, and the gate dielectric layer 470 on the surface 412 of the substrate 410. In some examples, the deposition operation is performed by using a CVD-like technique. For example, a deposition mode of the deposition operation may be between a deposition mode of an atomic layer deposition process and a deposition mode of a chemical vapor deposition process.

In certain examples, the first film 482a may be formed to further cover the first middle portion 424b of the first side surface 424 of the fin structure 420 and the second middle portions 464b of the second side surfaces 464 of the trench 460. Thicknesses of the first film 482a on the first middle portion 424b of the first side surface 424 of the fin structure 420 and the second middle portions 464b of the second side surfaces 464 of the trench 460 are smaller than those of the first film 482a on the top surface 422 of the fin structure 420, the first upper portion 424a and the first lower portion 424c of the first side surface 424 of the fin structure 420, and those on the second upper portions 464a and the second lower portions 464c of the second side surfaces 464 of the trench 460.

In forming the film structure 482, a re-deposition operation is performed on the first film 482a, the fin structure 420, and the trench 460, so as to form the film structure 482. For example, the re-deposition operation may be performed by using an atomic layer deposition technique. In some exemplary examples, as shown in FIG. 9A and FIG. 9B, the re-deposition operation is performed to form a second film 482b on the first film 482a, the first middle portion 424b of the first side surface 424 of the fin structure 420, and the second middle portions 464b of the second side surfaces 464 of the trench 460, such that the film structure 482 includes the first film 482a and the second film 482b. In the present embodiment, one or more re-deposition operations can be performed to form the film structure 482.

The film structure 482 on the first middle portion 424b of the first side surface 424 of the fin structure 420 and the second middle portions 464b of the second side surfaces 224 of the trench 460 is thinner than the film structure 482 on the top surface 422 of the fin structure 420, the first upper portion 424a of the first side surface 424 of the fin structure 420, and the second upper portions 464a of the second side surfaces 464 of the trench 460. In some exemplary examples, the film structure 482 on the top surface 422 of the fin structure 420 is thicker than the film structure 482 on the first lower portion 424c of the first side surface 424 of the fin structure 420. In certain examples, the second film 482b is not formed on the first middle portion 424b of the first side surface 424 of the fin structure 420 and the second middle portions 464b of the second side surfaces 264 of the trench 460.

In forming the film structure 484, a deposition operation is performed with at least one precursor by controlling a process temperature to control a saturated vapor pressure of the at least one precursor, so as to form a first film 484a on the film structure 482 on the top surface 422 of the fin structure 420, the first upper portion 424a and the first lower portion 424c of the first side surface 424 of the fin structure 420, the second upper 464a and the second lower portions 464c of the second side surfaces 464 of the trench 460, and the gate dielectric layer 470 on the surface 412 of the substrate 410. In some examples, a deposition mode of the deposition operation is between a deposition mode of an atomic layer deposition process and a deposition mode of a chemical vapor deposition process.

In certain examples, the first film 484a may be formed on the first middle portion 424b of the first side surface 424 of the fin structure 420 and the first middle portions 464b of the second side surfaces 464 of the trench 460, in which thicknesses of the first film 484a on the first middle portion 424b of the first side surface 424 of the fin structure 420 and the second middle portions 464b of the second side surfaces 464 of the trench 460 are smaller than those of the first film 484a on the top surface 422 of the fin structure 420, the first upper portion 424a and the first lower portion 424c of the first side surface 424 of the fin structure 420, and those on the second upper portions 464a and the second lower portions 464c of the second side surfaces 464 of the trench 460.

In forming the film structure 484, a re-deposition operation may be performed on the first film 484a and the film structure 482 by using an atomic layer deposition technique, so as to form the film structure 484. In some exemplary examples, as shown in FIG. 9A and FIG. 9B, performing the re-deposition operation includes forming a second film 484b on the first film 484a and the film structure 482, such that the film structure 484 includes the first film 484a and the second film 484b. In the present embodiment, more re-deposition operations can be performed to form the film structure 484.

The film structure 484 on the first middle portion 424b of the first side surface 424 of the fin structure 420 and the second middle portions 464b of the second side surfaces 224 of the trench 460 is thinner than the film structure 484 on the top surface 422 of the fin structure 420, the first upper portion 424a of the first side surface 424 of the fin structure 420, and the second upper portions 464a of the second side surfaces 464 of the trench 460. The film structure 484 on the top surface 422 of the fin structure 420 may be thicker than the film structure 484 on the first lower portion 424c of the first side surface 424 of the fin structure 420. In certain examples, the second film 484b is not formed on the film structure 482 on the first middle portion 424b of the first side surface 424 of the fin structure 420 and the second middle portions 464b of the second side surfaces 264 of the trench 460.

Referring to FIG. 9A, FIG. 9B, and FIG. 9C, the n-type work function metal 486 is formed on the film structure 484 and covers the film structure 484. The gate 488 is formed on the n-type work function metal 486 on the film structure 484 in the trench 460 to complete the semiconductor device 400. The gate 488 may be formed by using a physical vapor deposition technique.

In accordance with an embodiment, the present disclosure discloses a method for manufacturing a semiconductor device. In this method, a first raised structure is formed on a surface of a substrate. The first raised structure includes a top surface and a side surface adjoining the top surface, in which the side surface comprises an upper portion, a lower portion, and a middle portion which is sandwiched between the upper portion and the lower portion. A deposition operation is performed with at least one precursor to form a first film on the top surface of the first raised structure, the upper portion and the lower portion of the side surface of the first raised structure, and the surface of the substrate, in which performing the deposition operation includes controlling a saturated vapor pressure of the at least one precursor. A re-deposition operation is performed on the first film and the first raised structure, so as to form a film structure. A thickness of the film structure on the middle portion of the side surface of the first raised structure is smaller than a thickness of the film structure on the top surface of the first raised structure.

In accordance with another embodiment, the present disclosure discloses a method for manufacturing a semiconductor device. In this method, a substrate with a fin structure, a dummy gate, and two spacers is provided. The fin structure protrudes from a surface of the substrate, the dummy gate is disposed on a first portion of the fin structure, and the spacers are disposed on second portions of the fin structure and sandwich the dummy gate. The fin structure includes a top surface and a first side surface adjoining the top surface, and the first side surface includes a first upper portion, a first lower portion, and a first middle portion which is sandwiched between the first upper portion and the first lower portion. The dummy gate is removed to expose the first portion of the fin structure and to form a trench between the spacers. A gate dielectric layer is formed to cover the first portion of the fin structure, and a bottom surface and second side surfaces of the trench. A gate structure is formed on the gate dielectric layer in the trench. In forming the gate structure, a deposition operation is performed with at least one precursor to form a first film on the top surface of the fin structure, the first upper portion and the first lower portion of the first side surface of the fin structure, and the surface of the substrate, in which performing the deposition operation includes controlling a saturated vapor pressure of the at least one precursor. A re-deposition operation is performed on the first film and the fin structure, so as to form a film structure of the gate structure. A thickness of the film structure on the first middle portion of the first side surface of the fin structure is smaller than a thickness of the film structure on the top surface of the fin structure. A gate is formed on the film structure in the trench.

In accordance with yet another embodiment, the present disclosure discloses a semiconductor device. The semiconductor device includes a substrate, a fin structure, two spacers, a gate dielectric layer, and a gate structure. The fin structure protrudes from a surface of the substrate, in which the fin structure includes a first portion and two second portions which sandwich the first portion. The fin structure includes a top surface and a first side surface adjoining the top surface, in which the first side surface includes a first upper portion, a first lower portion, and a first middle portion which is sandwiched between the first upper portion and the first lower portion. Two spacers are disposed on the second portions of the fin structure to form a trench over the first portion of the fin structure. The gate dielectric layer covers the first portion of the fin structure, and a bottom surface and second side surfaces of the trench. The gate structure is disposed on the gate dielectric layer in the trench. The gate structure includes a film structure and a gate. The film structure includes a first film and a second film. The first film is disposed on the top surface of the fin structure, the first upper portion and the first lower portion of the first side surface of the fin structure, and the gate dielectric layer on the surface of the substrate. The second film is disposed on the first film. The gate is disposed on the film structure in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for manufacturing a semiconductor device, the method comprising:
forming a first raised structure on a surface of a substrate, wherein the first raised structure comprises a top surface and a side surface adjoining the top surface, wherein the side surface comprises an upper portion, a lower portion, and a middle portion which is sandwiched between the upper portion and the lower portion;

performing a deposition operation with at least one precursor to form a first film on the top surface of the first raised structure, the upper portion and the lower portion of the side surface of the first raised structure, and the surface of the substrate, wherein performing the deposition operation comprises controlling a saturated vapor pressure of the at least one precursor; and performing a re-deposition operation on the first film and the first raised structure, so as to form a film structure, wherein a thickness of the film structure on the middle portion of the side surface of the first raised structure is smaller than a thickness of the film structure on the top surface of the first raised structure.

2. The method of claim 1, wherein the re-deposition operation is performed by using an atomic layer deposition (ALD) technique.

3. The method of claim 1, wherein the thickness of the film structure on the middle portion of the side surface of the first raised structure is substantially equal to 0.

4. The method of claim 1, wherein the thickness of the film structure on the top surface of the first raised structure is greater than a thickness of the film structure on the lower portion of the side surface of the first raised structure.

5. The method of claim 1, wherein the film structure is formed from a $HfO_2$ based material, and a process temperature of the deposition operation substantially ranges from 170 degrees centigrade to 190 degrees centigrade.

6. The method of claim 1, wherein the film structure is formed from TiN, and a process temperature of the deposition operation substantially ranges from 25 degrees centigrade to 40 degrees centigrade.

7. The method of claim 1, wherein the film structure is formed from TaN, and a process temperature of the deposition operation substantially ranges from 65 degrees centigrade to 80 degrees centigrade.

8. The method of claim 1, wherein a material forming the film structure comprises TiAlC and TaAlC, and a process temperature of the deposition operation substantially ranges from 40 degrees centigrade to 60 degrees centigrade.

9. The method of claim 1, wherein performing the re-deposition operation comprises forming a second film on the first film and the middle portion of the side surface of the first raised structure.

10. The method of claim 1, wherein forming the first raised structure comprises forming a second raised structure on the surface of the substrate, wherein the second raised structure is adjacent to the first raised structure, and a thickness of the film structure on a region of the surface of the substrate between the first raised structure and the second raised structure is substantially equal to a thickness of the film structure on the other region of the surface of the substrate.

11. A method for manufacturing a semiconductor device, the method comprising:

providing a substrate with a fin structure, a dummy gate, and two spacers, wherein the fin structure protrudes from a surface of the substrate, the dummy gate is disposed on a first portion of the fin structure, and the spacers are disposed on second portions of the fin structure and sandwich the dummy gate, wherein the fin structure comprises a top surface and a first side surface adjoining the top surface, and the first side surface comprises a first upper portion, a first lower portion, and a first middle portion which is sandwiched between the first upper portion and the first lower portion;

removing the dummy gate to expose the first portion of the fin structure and to form a trench between the spacers;

forming a gate dielectric layer to cover the first portion of the fin structure, and a bottom surface and second side surfaces of the trench; and forming a gate structure on the gate dielectric layer in the trench, wherein forming the gate structure comprises:

performing a deposition operation with at least one precursor to form a first film on the top surface of the fin structure, the first upper portion and the first lower portion of the first side surface of the fin structure, and the surface of the substrate, wherein performing the deposition operation comprises controlling a saturated vapor pressure of the at least one precursor;

performing a re-deposition operation on the first film and the fin structure, so as to form a film structure of the gate structure, wherein a thickness of the film structure on the first middle portion of the first side surface of the fin structure is smaller than a thickness of the film structure on the top surface of the fin structure; and forming a gate on the film structure in the trench.

12. The method of claim 11, wherein the re-deposition operation is performed by using an atomic layer deposition technique.

13. The method of claim 11, wherein performing the re-deposition operation comprises forming a second film on the first film and the first middle portion of the first side surface of the fin structure.

14. The method of claim 11, wherein each of the second side surfaces of the trench comprises a second upper portion, a second lower portion, and a second middle portion sandwiched between the second upper portion and the second lower portion; and performing the deposition operation comprises forming the first film on the second upper portions and the second lower portions of the second side surfaces of the trench.

15. The method of claim 14, wherein a thickness of the film structure on each of the second middle portions of the second side surfaces of the trench is smaller than a thickness of the film structure on each of the second upper portions of the second side surfaces of the trench.

16. The method of claim 15, wherein the thickness of the film structure on the first middle portion of the first side surface of the fin structure and the thickness of the film structure on each of the second middle portions of the second side surfaces of the trench are substantially equal to 0.

17. The method of claim 14, wherein performing the re-deposition operation comprises forming a second film on the first film, the first middle portion of the first side surface of the fin structure, and the second middle portions of the second side surfaces of the trench.

18. A method for manufacturing a semiconductor device, the method comprising:

providing a substrate with a fin structure and two spacers, wherein the fin structure protrudes from a surface of the substrate, the spacers are respectively disposed on the fin structure and are separated from each other by a trench, and a first portion of the fin structure is exposed by the trench, wherein the fin structure comprises a top surface and a first side surface adjoining the top surface, and the first side surface comprises a first upper portion, a first lower portion, and a first middle portion which is sandwiched between the first upper portion and the first lower portion;

forming a gate dielectric layer to cover the first portion of the fin structure, and a bottom surface and second side surfaces of the trench;

forming a first film structure and a second film structure covering the first film structure, wherein forming the first film structure comprises:

performing a first deposition operation with at least one first precursor to form a first film on the top surface of the fin structure, the first upper portion and the first lower portion of the first side surface of the fin structure, and the surface of the substrate; and performing a first re-deposition operation to form a second film on the first film and the fin structure, so as to form the first film structure, wherein a thickness of the first film structure on the first middle portion of the first side surface of the fin structure is smaller than a thickness of the first film structure on the top surface of the fin structure; and forming a gate on the second film structure in the trench.

19. The method of claim 18, wherein forming the second film structure comprises:

performing a second deposition operation with at least one second precursor to form a third film on the first film structure on the top surface of the fin structure, the first upper portion and the first lower portion of the first side surface of the fin structure, and the surface of the substrate; and performing a second re-deposition operation on the third film and the first film structure, wherein a thickness of the second film structure on the first middle portion of the first side surface of the fin structure is smaller than a thickness of the second film structure on the top surface of the fin structure.

20. The method of claim 19, wherein each of the second side surfaces of the trench comprises a second upper portion, a second lower portion, and a second middle portion sandwiched between the second upper portion and the second lower portion;

performing the first deposition operation comprises forming the first film on the second upper portions and the second lower portions of the second side surfaces of the trench; and performing the second deposition operation comprises forming the third film on the first film structure on the second upper portions and the second lower portions of the second side surfaces of the trench.

* * * * *